United States Patent [19]

Okazaki et al.

[11] Patent Number: 4,687,996
[45] Date of Patent: Aug. 18, 1987

[54] METHOD AND APPARATUS FOR MEASURING REMAINING CHARGE OF GALVANIC CELL

[75] Inventors: Susumu Okazaki, Ikeda; Shunichi Higuchi, Hirakata; Osamu Nakamura, Ikeda; Sachio Takahashi, Minoo, all of Japan

[73] Assignee: Agency of Industrial Science & Technology, Ministry of International Trade & Industry, Tokyo, Japan

[21] Appl. No.: 699,090

[22] Filed: Feb. 7, 1985

[30] Foreign Application Priority Data

Feb. 9, 1984 [JP] Japan .................................. 59-23896
Feb. 9, 1984 [JP] Japan .................................. 59-23897

[51] Int. Cl.$^4$ ..................... G01N 27/46; H02J 7/04; G08B 21/00
[52] U.S. Cl. .................................. 324/436; 324/425; 320/48; 340/636
[58] Field of Search ............... 324/425, 426, 436, 428, 324/71.2 E, 427, 430, 433; 340/636; 320/48, 39

[56] References Cited

U.S. PATENT DOCUMENTS 3,808,487 4/1974 Feuillade ................. 320/21
3,984,762 10/1976 Dowgiallo, Jr. ............ 320/48
4,498,044 2/1985 Horn ..................... 324/436

OTHER PUBLICATIONS

E. Willihnganz; "Battery Impedance"; Sep. 1959; Electrical Engineering; pp. 922–925.

Primary Examiner—Reinhard J. Eisenzopf
Assistant Examiner—Vinh P. Nguyen
Attorney, Agent, or Firm—Oblon, Fisher, Spivak, McClelland & Maier

[57] ABSTRACT

A method and apparatus for measuring the remaining charge of a galvanic cell effects the measurement of the remaining charge by superimposing an AC voltage or current on DC voltage or current issuing from the cell to produce a higher harmonic current or voltage, determining the value corresponding to a higher harmonic component of n'th order from the higher harmonic current or voltage, and comparing the value thus measured of the cell under test with that measured previously in the same manner of a reference galvanic cell. Since the corresponding value of the higher harmonic current or voltage of n'th order varies notably with the decrease in the remaining charge of the galvanic cell, the comparison of the found corresponding value with the reference characteristic is effected with ease and the measurement can be carried out accurately and simply.

8 Claims, 10 Drawing Figures

METHOD AND APPARATUS FOR MEASURING REMAINING CHARGE OF GALVANIC CELL

BACKGROUND OF THE INVENTION

1. FIELD OF THE INVENTION

This invention relates to a method and apparatus for measuring the remaining charge of various galvanic cells, and more particularly to a method and apparatus for simple yet accurate measurement of the remaining charge of various galvanic cells, inclusive of primary or secondary cells, or the amount of electricity with which the galvanic cell has been charged.

2. DESCRIPTION OF THE PRIOR ART

As a way of finding out the remaining charge of a given galvanic cell, the measurement of terminal voltage, impedance, ect. of the galvanic cell has been generally resorted to. These quantities vary very slightly with variation in the remaining charge of the galvanic cell within the range of normal use (1.6 to 0.9 V, 1 to 2 Ω (at 31.2 Hz) in a manganese dry cell (Ever Ready SP11), for example). Moreover, these quantities vary greatly depending on the presence or absence of load or on how long the cell has been released from load. Thus, they cannot be relied on to indicate the remaining charge with accuracy. More often than not the dependence of impedence upon charge lacks linearity as by possessing a minimum value, for example. In the case of the lead acid battery which is the secondary battery currently in most popular use, the remaining charge is found by measuring the specific gravity of the aqueous sulfuric acid solution used as the electrolytic solution therein. This method inevitably requires a prescribed amount of the dilute sulfuric acid to be removed as a sample from the battery, making the measurement quite inconvenient. Incorporation in the battery of a float or a refractance measuring cell as means of measurement has been proposed. The former version has the disadvantage that the mechanism of measurement is vulnerable to vibration, the float is liable to get caught, and the float tends to gather bubbles possibly to the extent of jeopardizing the accuracy of measurement. The latter version has the disadvantage that the accuracy of measurement is impaired by the dirt adhering to the cell and the instable intensity of the light source. In another method, measurement of the concentration of sulfuric acid solution is effected using a second miniature cell disposed within the battery. This method is disadvantageous in that the battery has a complicated construction and the second miniature cell itself is susceptible to deterioration.

SUMMARY OF THE INVENTION

An object of the present invention is to provide a method and apparatus for simple and accurate measurement of the remaining charge of various galvanic cells inclusive of primary and secondary cells, for example, without requiring any alteration or modification of battery construction.

To accomplish the object described above, the method of the present invention for the measurement of the remaining charge of a galvanic cell is characterized by superimposing an AC voltage or current on the DC voltage or current issuing from a reference galvanic cell of known remaining charge thereby measuring the magnitude of current or voltage corresponding to the higher harmonic current or voltage of n'th order ($n > 1$) of the current or voltage obtained in consequence of the aforementioned superimposition and, consequently, determining the reference characteristic between the remaining charge of the reference galvanic cell and the magnitude of current or voltage corresponding to the higher harmonic current or voltage of n'th order, superimposing the same AC voltage or current as used on the aforementioned reference galvanic cell on the DC voltage or current issuing from a galvanic cell under test similar in kind to the reference galvanic cell thereby measuring the magnitude of current or voltage corresponding to the higher harmonic current or voltage of n'th order of the current or voltage obtained in consequence of the aforementioned superimposition, comparing the magnitude of measured current or voltage of the galvanic cell under test with that of the reference galvanic cell thereby determining the remaining charge of the galvanic cell under test.

The apparatus of the present invention for working the method described above and effecting measurement of the remaining charge of a galvanic cell comprises an AC power source for superimposing an AC voltage or current on a DC voltage or current of a galvanic cell flowing through a circuit connecting the opposite electrodes of the galvanic cell thereby generating an harmonic current voltage of n'th order ($n > 1$) in the circuit and a detector for measuring the value corresponding to a higher harmonic component of a specific order in the aforementioned n'th harmonic current or voltage generated by the aforementioned AC power source.

Since current and voltage are regarded on the same order, the value corresponding to the higher harmonic components of a specific order to be measured may be a higher harmonic current or voltage. To be more specific, the AC power source is composed of an oscillator for generating an AC voltage at a controlled level and a potentiostat for superimposing the AC voltage from the oscillator on the DC voltage generated by a galvanic cell in the circuit and the detector is composed of a resistance incorporated in the aforementioned circuit, a higher harmonic filter and an AC voltmeter disposed in parallel to the resistance, whereby the higher harmonic current of a specific order is extracted by the aforementioned filter from the current obtained by superimposing an AC voltage on the DC voltage generated by a galvanic cell in the circuit and the value corresponding to the higher harmonic component of specific order is detected by the AC voltmeter. Alternatively, the AC power source is composed of an oscillator for generating an AC voltage at a controlled level and a galvanostat controlled by the oscillator for superimposing the AC current on the DC current generated by a galvanic cell in the circuit and the detector is composed of a higher harmonic filter and an AC voltmeter disposed in parallel to the aforementioned galvanostat, whereby the value corresponding to the higher harmonic component of a specific order can be detected.

Before the measuring apparatus constructed as described above is put in use in the actual measurement of the remaining charge of a galvanic cell, it is operated on the reference galvanic cell of known remaining charge to determine the reference characteristic of the value of the n'th harmonic component of the reference galvanic cell and keep a record of the results of the determination in the form of a graph, for example, for ready reference in the subsequent actual measurement. Then, the remaining charge of a given galvanic cell can be determined by operating the apparatus on the galvanic cell under the same conditions and comparing the value corresponding to the higher harmonic component of a specific order with the aforementioned reference characteristic.

In accordance with the present invention, when the AC voltage or current is applied to the terminals of the galvanic cell as being superimposed on the DC voltage or current issuing from the galvanic cell, the higher harmonic component in the current or voltage of the circuit and the ratio between the fundamental tone and the higher harmonic component vary largely in proportion to the decrease in the remaining charge of the galvanic cell. Thus, accurate measurement of the remaining charge can also be attained by using this ratio.

DESCRIPTION OF THE PREFERRED EMBODIMENTS

This invention relates to a method and apparatus for accurate and convenient measurement of the remaining charge of a galvanic cell. This invention does not discriminate among galvanic cells by type, size, or any other factors. It is applicable to numerous galvanic cells including primary cells such as the manganese dry cell, mercury cell, alkaline-magnanese dry cell, silver oxide cell, silver chloride cell, air cell, and lithium cell and secondary cells such as the lead acid battery and nickel-cadmium cell. The term "remaining charge" as used herein should be understood broadly to include both the quantity left in the cell after a period of discharging and the quantity contained therein after a period of charging.

Now, a typical apparatus for working the method of this invention for measuring the remaining charge of a galvanic cell as one embodiment of this invention will be described below with reference to FIG. 1.

In the diagram, 1 denotes a galvanic cell subjected to measurement of remaining charge. This galvanic cell 1 is either a reference galvanic cell of known remaining charge or a given galvanic cell of unknown remaining charge. The former reference galvanic cell can be regarded as one object of measurement by the apparatus. For the convenience of description, therefore, either of them will be described hereinafter as an object of measurement unless otherwise specified.

By 2 is denoted an AC power source connected to a circuit 3 which joins the opposite electrodes of the galvanic cell 1. The AC power source 2 serves to superimpose an AC voltage or current on the DC voltage or current of the galvanic cell 1 flowing through the circuit 3 thereby to generate a harmonic current or voltage of n'th order (n>1) in the circuit 3. Since voltage and current belong under the same order, either of them may be selected as the criterion of measurement. In the embodiment illustrated in FIG. 1, since the AC voltage from the AC power source 2 is applied to be superimposed on the DC voltage of the galvanic cell 1, the value corresponding to the higher harmonic current of a specific order is consequently obtained. The AC power source 2 in the present embodiment, therefore, is composed of an oscillator 4 for generating an AC voltage at a controlled level and a potentiostat 5 for causing the AC voltage from the oscillator 4 to be superimposed on the DC voltage generated by the galvanic cell in the circuit 3. Although the oscillator 4 involved herein is not specified as to its construction, it is desired to possess the function of enabling variation of frequency or variation of amplitude.

A detector 6 is disposed in the circuit between the galvanic cell 1 and the AC power source 2. The detector 6 serves to extract the higher harmonic component of a specific order from the current or voltage obtained in the circuit 3 as a result of the aforesaid superimposition, and determine the value corresponding to the extracted component of specific order. Since voltage and current belong under the same order as described above, either of them can be selected for the purpose of this extraction. In the present embodiment, since the higher harmonic current is used as the criterion of measurement, the detector 6 is constructed so as to determine the value corresponding to the higher harmonic current representing the harmonic component of a specific order. Thus, the detector 6 of the present embodiment is composed of a resistance 7 disposed in the circuit 3 and a higher harmonic filter 8 and an AC voltmeter 9 connected to the opposite terminals of the resistance 7. The resistance 7 is serially connected to the galvanic cell 1 and the AC power source 2 and, consequently, the higher harmonic filter 8 and the AC voltmeter 9 which are serially arranged and are jointly connected in parallel to the resistance 7. As a result, the higher harmonic component of the electric current flowing through the circuit 3 is fed out through the filter 8 in the form of output voltage, which is measured by the volmeter 9. The filter 8 is desired to be capable of feeding out the higher harmonic component of a desired order. When the characteristic curve showing the relation between the value corresponding to the higher harmonic current of n'th order of the galvanic cell under test or an equivalent galvanic cell and the remaining charge of the galvanic cell is obtained in advance, the remaining charge of the galvanic cell under test can be determined on the basis of the value corresponding to the higher harmonic current to be actually found by measurement.

Now, the operation of the aforementioned embodiment will be described in detail below with reference to an experiment conducted by using a lead acid battery as the galvanic cell under test.

Figure 1:
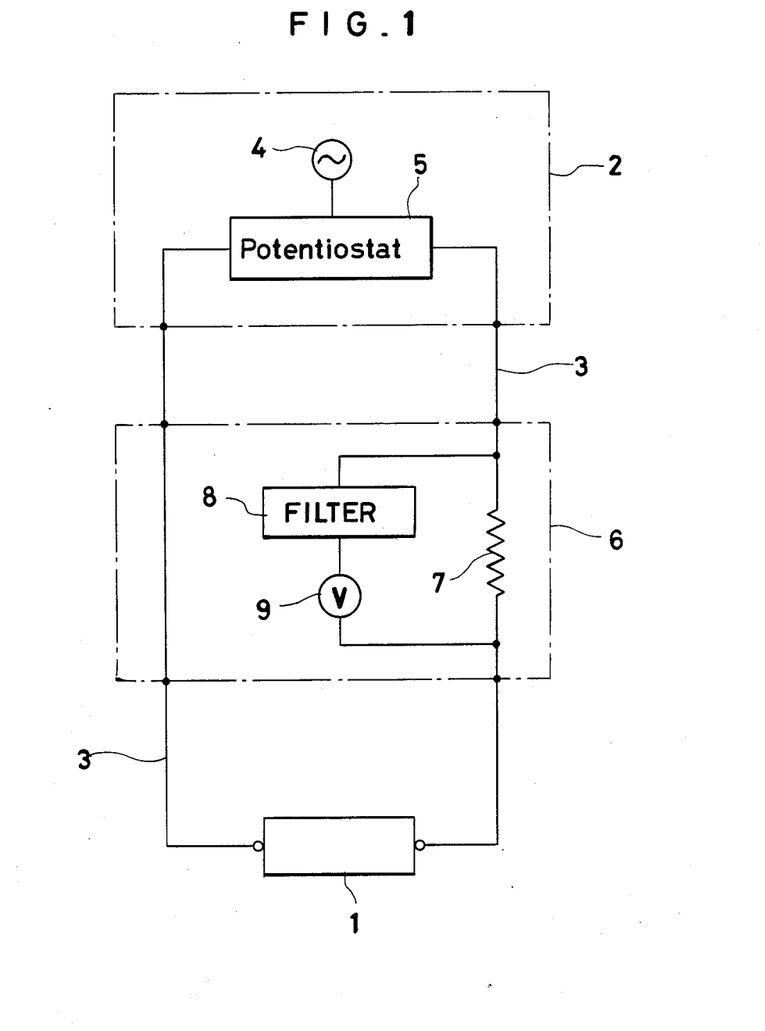
FIG. 1 is a schematic block circuit diagram of a typical apparatus as one embodiment of the present invention.

The oscillator 4 and the potentiostat 5 which make up the AC power source 2, and the higher harmonic filter 8, the voltmeter 9 and 10-mΩ resistance 7 which make up the detector 6 were connected as illustrated in FIG. 1. As the galvanic cell 1 for test, a commerically available pasted type lead acid battery having a nominal voltage of 6 V and a nominal capacity of 12 Ah was used.

To vary the remaining charge of the galvanic cell, this cell 1 was connected to a suitable resistance (load), caused to discharge direct current (2.4 A) for a fixed duration (15 to 30 minutes), and left standing for five minutes. Then, the galvanic cell and the measuring apparatus of the present invention were connected as illustrated in FIG. 1. By the oscillator 4, a voltage was applied through the potentiostat 5 to the circuit 3 to produce a sine-wave perturbing voltage 70 mVrms of amplitude and 1 Hz of frequency between the opposite electrodes of the galvanic cell. One minute after this voltage application, the value of the second harmonic component of the current flowing through the circuit was measured. The procedure of discharging, application, and measurement was repeated until the galvanic cell was thoroughly discharged. During the test, the ambient temperature was kept at 25° C.

Figure 2:
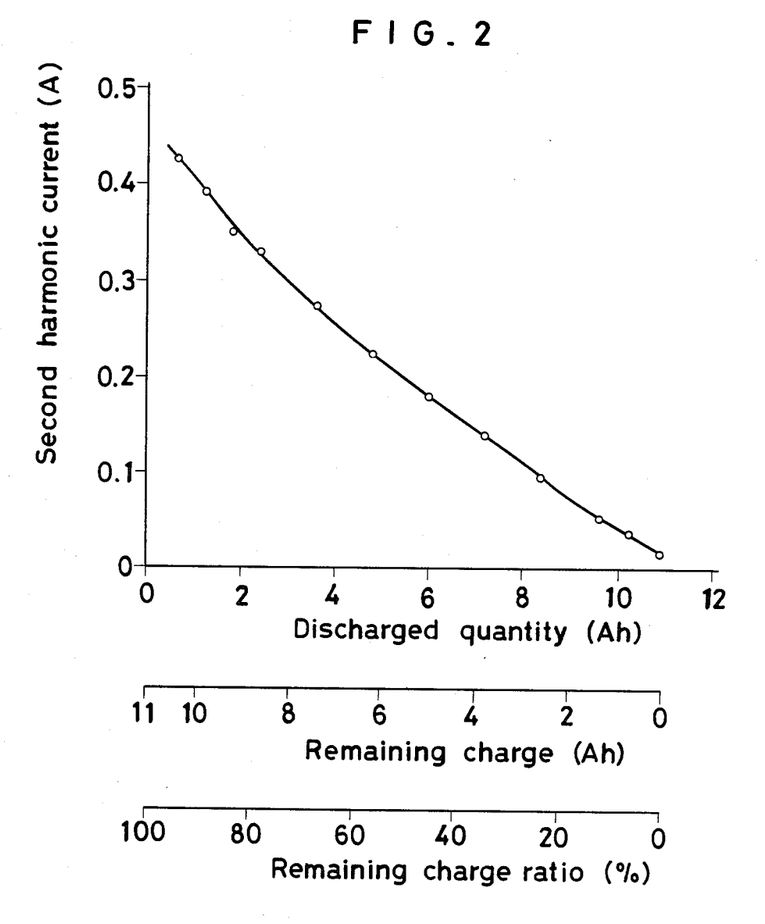
FIG. 2 is a characteristic curve showing the relation between the second harmonic current and the remaining charge.

The characteristic curve of the value of the second harmonic current (A) formed by the measurement vs. the charge (Ah) discharged, the remaining charge (Ah), and the remaining charge ratio (%) is shown in FIG. 2. The term "remaining charge ratio" as used herein means the value expressed by the following formula.

Remaining charge ratio = (1)

$$\frac{\text{Maximum dischargeable quantity} - \text{Discharged quantity}}{\text{Maximum dischargeable quantity}} \times 100\ (\%)$$

The curve of the second harmonic current as the function of the value corresponding to the remaining charge shown in FIG. 2 varies notably with the decrease in the remaining charge. When this graph is obtained in advance of the measuring apparatus by using a reference galvanic cell of known remaining charge, the remaining charge of a given galvanic cell can be easily and accurately determined without requiring incorporation of any special device in the galvanic cell simply by measuring the magnitude of the second harmonic current of the galvanic cell.

Optionally, the higher harmonic filter may be enabled to feed out the fundamental tone of the current of the circuit (n=1) and consequently permit the value of the fundamental tone current to be measured in conjunction with the value of the harmonic current of n'th order (n>1). The ratio (in percentage) of the value of the fundamental tone current to that of the second harmonic current measured similarly to the experiment mentioned above by the apparatus using the higher harmonic filter modified as just described is graphically shown in FIG. 3 similarly to FIG. 2.

Figure 3:
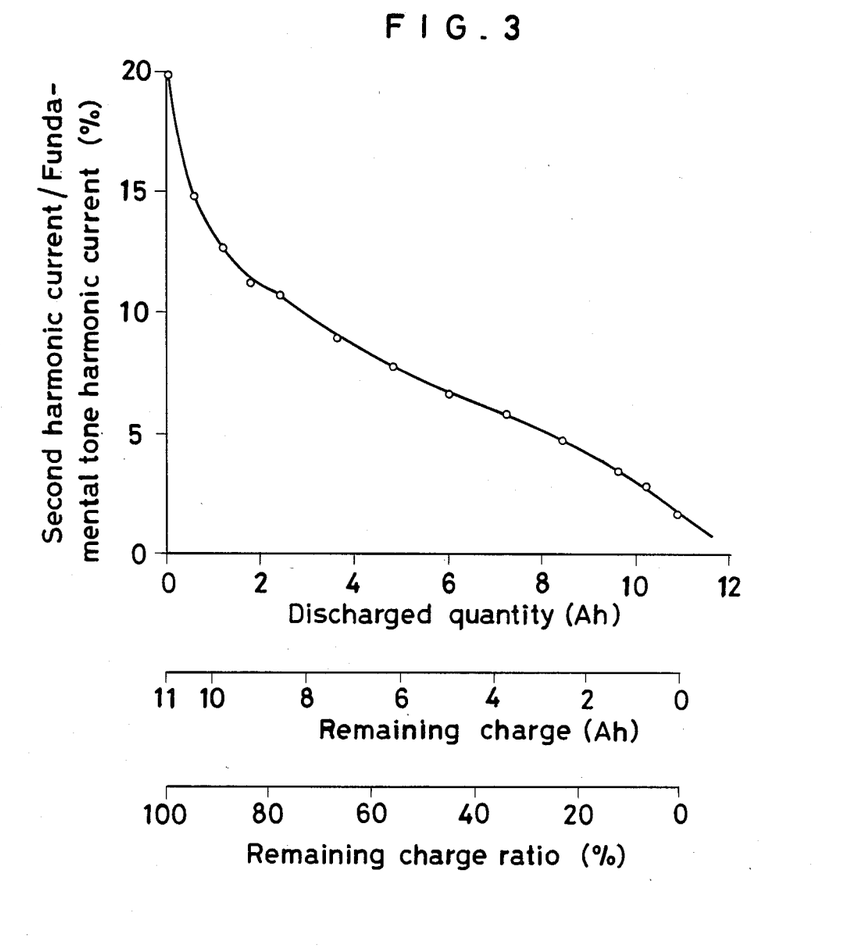
FIG. 3 is a characteristic curve showing the relation between the ratio of the second harmonic current to the fundamental tone current and the remaining charge.

The curve of the ratio of the value corresponding to the remaining charge to that corresponding to the harmonic current of n'th order shown in FIG. 3 also varies notably with the decrease in the remaining charge. When this graph is obtained in advance, therefore, the remaining charge of a galvanic cell can be determined easily and accurately without requiring incorporation of any special device in the galvanic cell merely by measuring the value of the fundamental tone current and that of the second harmonic current of the galvanic cell.

Figure 4:
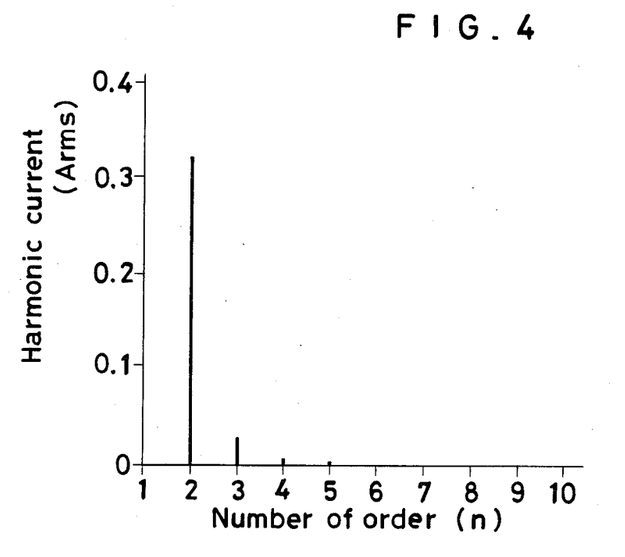
FIG. 4 is a graph showing the higher harmonic current spectrum obtained by the application of an AC voltage of 1 Hz.
Figure 5:
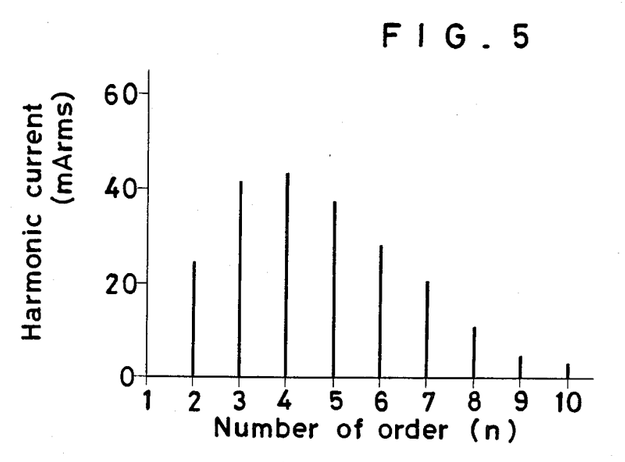
FIG. 5 is a graph showing the higher harmonic current spectrum obtained by the application of an AC voltage of 1 kHz.

In the embodiment described above, the second harmonic current is used as the particular higher harmonic current necessary for determination. This does not mean that the higher harmonic current component to be measured is limited to the second harmonic current. Depending on the kind of the galvanic cell to be tested and the amplitude and frequency of the AC voltage applied, a harmonic current of a higher order may be selected as the object of measurement. FIG. 4 represents a spectrum of the higher harmonic current obtained by the application of an AC voltage to the same lead acid battery as used in the aforementioned experiment under the same conditions. The horizontal axis of the graph is the scale of the number of order (n) of the higher harmonic current and the vertical axis the scale of the amplitude (A rms) of the higher harmonic current of n'th order. FIG. 5 represents a spectrum of the higher harmonic current, similar to the spectrum of FIG. 4, obtained by using the same storage battery, with the frequency of the AC voltage changed to 1 kHz. Comparison of FIG. 4 and FIG. 5 reveals that where the frequency is increased to 1 kHz, the determination can be carried out more advantageously by measuring the higher harmonic component of 3rd or 4th order.

Although the frequency and the amplitude of the AC voltage are variable with the type and the charge of the galvanic cell, their proper values are respectively in the ranges of 0.01 Hz to 20 kHz and 5 mVpp to 12 Vpp.

Figure 6:
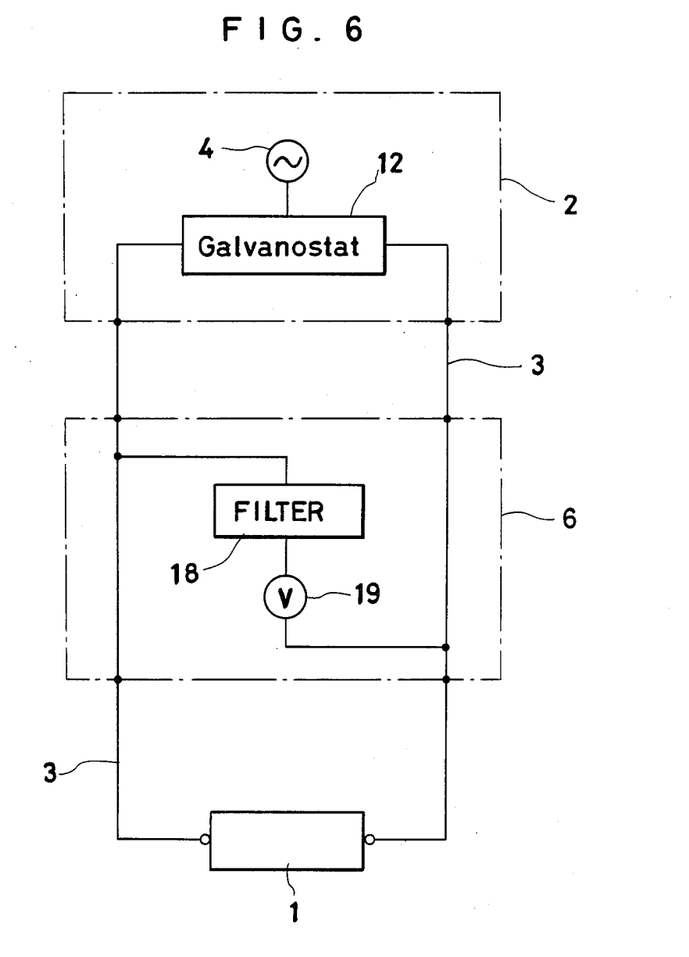
FIG. 6 is a schematic block circuit diagram of another embodiment of the present invention.

FIG. 6 represents a block circuit diagram of a typical measuring apparatus as another embodiment of the present invention. In the diagram, the same symbols as found in the former embodiment denote identical or similar parts. These parts will not be described below to avoid useless repetition.

In the present embodiment, the AC current from the AC power source 2 is superimposed on the DC current of the galvanic cell 1 consequently to determine the value corresponding to the higher harmonic voltage of a specific order as the object of measurement. In the apparatus of this embodiment, therefore, the AC power source 2 is composed of an oscillator 4 for feeding out an AC current at a controlled level and a galvanostat 12 controlled by the oscillator 4 for superimposing the AC current on the DC current from the galvanic cell in the circuit 3.

The detector 6 in this apparatus is composed of a higher harmonic filter 18 similar to the filter in the preceding embodiment and an AC voltmeter 19 disposed serially relative to the filter 18. The higher harmonic filter 18 and the AC voltmeter 19 are disposed in parallel to the galvanic cell 1 and the AC power source 2.

Owing to the construction described above, the galvanostat 12 causes the AC current from the oscillator 4 to be superimposed on the DC current from the galvanic cell in the circuit 3 consequently to generate the higher harmonic current of n'th order, the higher harmonic filter 18 allows the higher harmonic current of n'th order to pass therethrough, and the voltmeter 19 finds the value corresponding to the higher harmonic component thus obtained.

Now, the operation of the apparatus constructed as described above will be described hereinafter with reference to an experiment carried out on the apparatus in measurement of the remaining charge of a manganese dry cell (R14). This dry cell was connected to a suitable resistance (load) and left to discharge a direct current (0.2 A) for a fixed period (20 minutes). After the discharging, the dry cell was connected to the measuring circuit as illustrated in FIG. 6. By the oscillator 4, an AC voltage was applied to the circuit 3 through the galvanostat 15 to produce a sine-wave perturbing current of 0.14 A rms in amplitude and 10 Hz in frequency in the circuit 3 across the opposite electrodes of the cell, to permit measurement of the value of the second harmonic component of the voltage between the opposite electrodes of the cell 1. The procedure of discharging, application of voltage, and measurement was repeated at room temperature until the cell was completely discharged.

Figure 7:
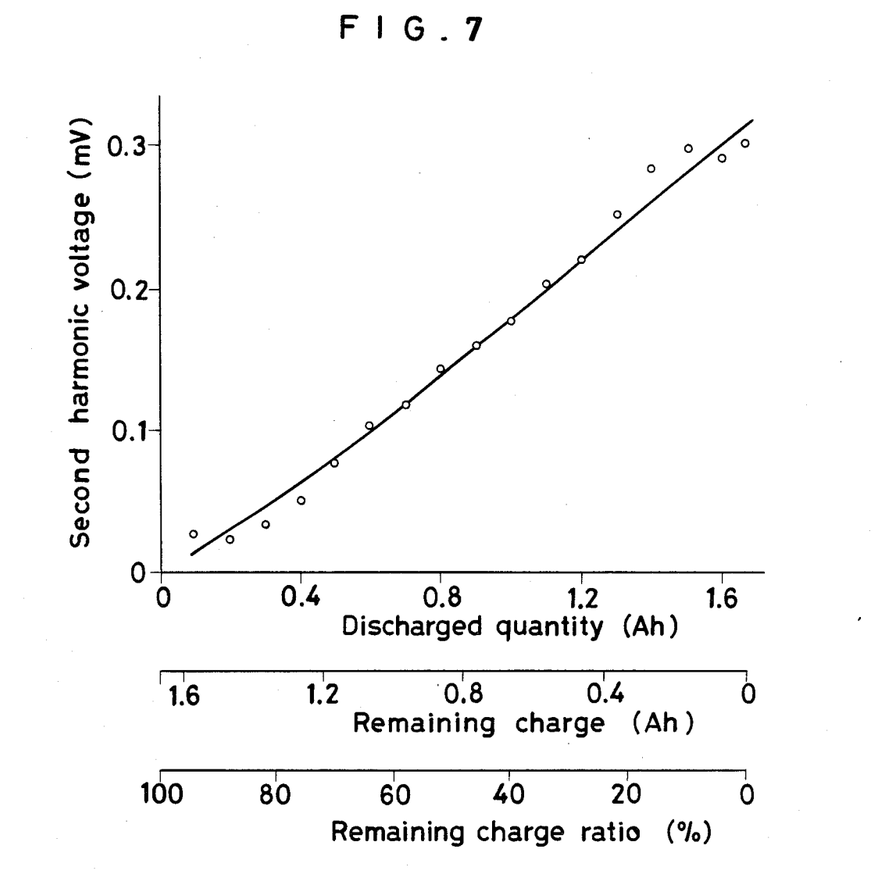
FIG. 7 is a characteristic curve showing the relation between the second harmonic voltage and the remaining charge.

A graph showing the value of the second harmonic voltage (V) so found as the function of the discharged quantity (Ah), the remaining charge (Ah), and the remaining charge ratio (%) is given in FIG. 7. The term "remaining charge ratio" as used herein means what is expressed by the formula (1) given above with reference to the preceding embodiment.

Figure 8:
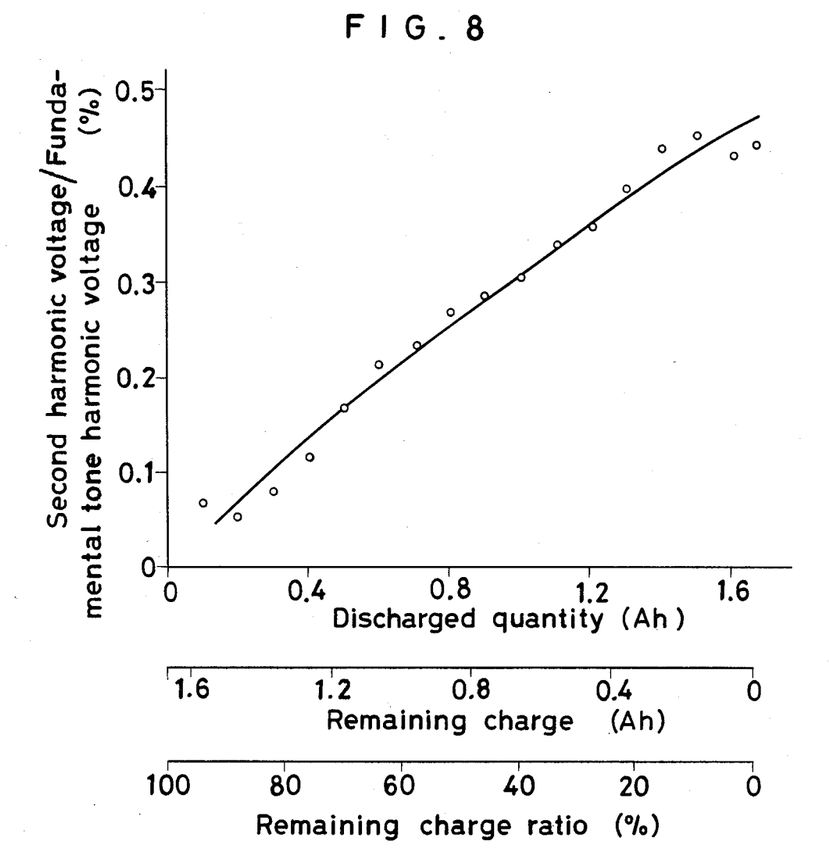
FIG. 8 is a characteristic curve along the relation between the ratio of the second harmonic voltage to the fundamental tone voltage and the remaining charge.

FIG. 8 shows, similarly to FIG. 7, the ratio (percentage) of the value corresponding to the fundamental tone voltage to that of the second harmonic voltage both found in the experiment. The characteristic observed in the characteristic curves obtained in the preceding embodiment and indicated in FIGS. 2-3 is also prominent in the characteristic curves of FIGS. 7-8. Since the characteristic varies so much as to be easily compared in the course of measurement, the remaining charge of the galvanic cell can be easily and accurately determined.

Figure 9:
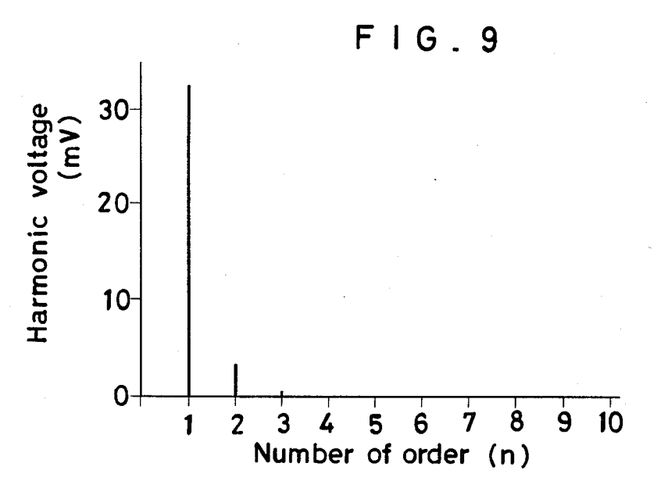
FIG. 9 is a graph showing the higher harmonic voltage spectrum obtained by the application of an AC voltage of 1 Hz.

FIG. 9 represents a spectrum of the higher harmonic voltage obtained by the application of an AC current 0.8 A rms in amplitude and 1 Hz in frequency to a pasted type lead storage battery (5N12A-2C), based on the same conditions as involved in FIG. 4.

Figure 10:
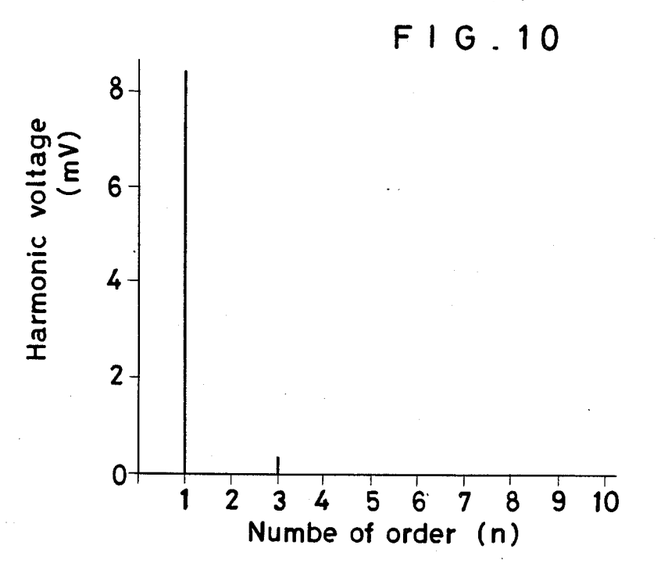
FIG. 10 is a graph showing the higher harmonic voltage spectrum obtained by the application of an AC voltage of 100 Hz.

FIG. 10 represents a spectrum of the high harmonic component of the same order as in FIG. 9, obtained on the same storage battery, with the frequency of the AC current changed to 100 Hz. Comparison of FIG. 9 and FIG. 10 reveals that when the frequency is increased to 100 Hz, the determination of the remaining charge can be carried out more advantageously by measuring the higher harmonic component of 3rd order.

The circuit configurations of the two embodiments described above, i.e. the apparatuses of FIG. 1 and FIG. 6, can be easily reduced in size by the known microelectronic techniques, they can be easily incorporated in automotive dashboards or in small measuring instruments using galvanic cells as power sources. The remaining charge of a galvanic cell can be automatically displayed or a device for recharging the galvanic cell automatically controlled by storing the characteristic curve of the galvanic cell as illustrated in FIGS. 2, 3, 7, and 8 in a nonvolatile memory and comparing the relevant content of the memory with the output from the measuring apparatus with the aid of a microprocessor. The relation between the higher harmonic current or voltage and the remaining charge or the relation between the fundamental tone current of voltage and the higher harmonic current or voltage on the one part and the remaining charge on the other part is variable with the type and the charge of the particular galvanic cell to be tested. It is, therefore advisable for the aforementioned memory to be designed in a replaceable pattern such that when the galvanic cell currently in use is replaced with a galvanic cell of a different type, the memory will be replaced with a memory which stores contents proper for the new galvanic cell. In this arrangement, the change of cell type does not entail complete replacement of the measuring apparatus. One and the same measuring apparatus satisfactorily serves to determine the remaining charge of the galvanic cell of the new type. In this case, the practice of preparatorily storing in the memory the amplitude and the frequency of the AC voltage or current to be applied and the number of order of the higher harmonic component to be measured and, in accordance with the contents of the memory, controlling the oscillator and other components of the apparatus and consequently effecting measurement befitting the type, and the charge of the galvanic cell proves highly advantageous.

The chemical reaction taking place within the galvanic cell varies with the ambient temperature and the actual cycle of recharging and discharging of the galvanic cell. It is, therefore, proper to find in advance characteristics of the galvanic cell dependent on a plurality of sets of ambient temperatures and actual cycle, store these characteristics in the memory, and compensate for found ambient temperature and frequency suitably with the aid of a microprocessor.

As described above, the present invention provides a method of accurately determining the remaining charge of a galvanic cell without requiring incorporation of any special device in the galvanic cell and an apparatus, simple in construction and not expensive, for working the method.

What is claimed is:

1. A method for measurement of a charge remaining in a galvanic cell, which comprises the steps of:

superposing an AC voltage or current on a DC voltage or current from a reference galvanic cell of know remaining charge to produce an output current or voltage having fundamental tone current or voltage of the same frequency as that of the superposed AC voltage or current and a higher harmonic current or voltage of secondary or higher order;

extracting said higher harmonic current or voltage of secondary or higher order from said output current or voltage of said reference galvanic cell;

measuring the current or voltage value corresponding to said higher harmonic current or voltage to predetermine reference characteristic of said higher harmonic current or voltage with respect to said known remaining charge of said reference galvanic cell;

superposing an AC voltage or current on a DC voltage or current from a measuring galvanic cell under test to produce an output current or voltage having a fundamental tone current or voltage of the same frequency as that of the AC voltage or current superposed on said DC voltage or current and a higher harmonic current or voltage of secondary or higher order;

extracting said higher harmonic current or voltage of secondary of higher order from said output current or voltage of said galvanic cell under test;

measuring current or voltage value corresponding to said higher harmonic current or voltage of secondary or higher order on said galvanic cell under test; and comparing said measured current or voltage value of said galvanic cell under test with said current or voltage value of said reference galvanic cell having said predetermined reference characteristic, thereby determining the remaining charge of said galvanic cell under test.

2. A method according to claim 1, wherein the determination of the reference characteristic and the comparison of said measured current or voltage value of said galvanic cell under test with the said current or voltage value of the reference galvanic cell having said predetermined reference characteristic are carried out on the basis of the ratio of the value corresponding to said fundamental tone current or voltage to the value corresponding to the higher harmonic current or voltage of secondary or higher order.

3. A method according to claim 1, wherein the higher harmonic component of the specific order which produces a largest harmonic spectrum thereof is utilized for measurement.

4. An apparatus for measuring a charge remaining in a a galvanic cell, which comprises:

connection circuit for connecting the opposite electrodes of a primary or secondary galvanic cell under test;

an AC power source having a potentiostat for generating an AC voltage, which is for superposing said AC voltage on a DC voltage from said galvanic cell to produce an output current including a higher harmonic current of secondary or higher order, and an oscillator for controlling said potentiostat by said AC voltage at a controlled level; and a detector composed of a resistance disposed in said connection circuit, a higher harmonic filter connected in parallel to said resistance for passing separately a fundamental tone current and a higher harmonic current of a specific order of said output current, and an AC voltmeter connected in parallel to said resistance and serially to said filter and adapted to measure value corresponding to said fundamental tone current or said higher harmonic current passing through said filter.

5. An apparatus according to claim 4, wherein said oscillator capable of feeding out an AC voltage is variable in frequency and amplitude.

6. An apparatus according to claim 4, wherein said higher harmonic filter permits variation of the number of the order of said higher harmonic component to be passed.

7. An apparatus for measuring a charge remaining in a galvanic cell, which comprises:

connection circuit for connecting the opposite electrodes of a primary or secondary galvanic cell under test;

an AC power source having a galvanostat for generating an AC current, which is for superposing said AC current on a DC current from said galvanic cell to produce an output voltage including a higher harmonic voltage of secondary or higher order, and an oscillator for controlling said galvanostat by said AC voltage at a controlled level; and a detector composed of a higher harmonic filter connected in parallel to said galvanostat for passing separately a fundamental tone voltage and a higher harmonic voltage of a specific order of said output voltage, and an AC voltmeter connected to parallel to said galvanostat and serially to said filter for measuring value corresponding to said fundamental tone voltage or said higher harmonic voltage passing through said filter.

8. An apparatus according to claim 7, wherein said higher harmonic filter permits variation of the number of the order of said higher harmonic component to be passed.

* * * * *